United States Patent [19]

Bisotto et al.

[11] Patent Number: 4,677,594

[45] Date of Patent: Jun. 30, 1987

[54] ADDRESSING CIRCUIT FOR A MATRIX DISPLAY INCORPORATING SHIFT REGISTERS FORMED FROM STATIC MEMORIES AND ADDRESSING PROCESS USING SUCH A CIRCUIT

[75] Inventors: Sylvette Bisotto, Le Fontanil-Cornillon; Jean-Philippe Blanc, St. Martin d'Heres; Bernard Bodin, Sassenage; Robert Poujois, Sinard, all of France

[73] Assignee: Commissariat a l'Energie Atomique, Paris, France

[21] Appl. No.: 696,329

[22] Filed: Jan. 30, 1985

[30] Foreign Application Priority Data

Jan. 31, 1984 [FR] France .............................. 84 01479

[51] Int. Cl.$^4$ ............................................ G11C 13/00
[52] U.S. Cl. .................................... 365/240; 365/45; 365/230
[58] Field of Search ................ 365/45, 108, 106, 149, 365/189, 191, 230, 240

[56] References Cited

U.S. PATENT DOCUMENTS 4,330,852  5/1982  Redwine et al.
4,393,482  7/1983  Yamada

OTHER PUBLICATIONS

Flache Fernseh-Bildschirme by A. Fischer, Nachrichtentechnische Zeitschrift NTZ, vol. 33, No. 2.
Handbuch der Digitalen Schaltungen, by E. A. Zuiderveen

*Primary Examiner*—Terrell W. Fears
*Attorney, Agent, or Firm*—Michael N. Meller

[57] ABSTRACT

Addressing circuit for a matrix display having shift registers formed by static memories and process for addressing with such a circuit.

For a display with p columns, the circuit comprises p register points formed by static memories ($M_i$), a first series of switches ($C_1$) placed in front of the register points $M_{k-1}$, k being an even number between 1 and p, a second series of switches ($C_2$) placed in front of the register points $M_k$ and a transfer clock (13) producing a first signal ($\phi_1$) controlling the first series of switches, in order to ensure the loading of a "1" signal into the register point ($M_1$) and the transfer of the content of register point $M_k$ to register point $M_{k+1}$, and a second signal ($\phi_2$) controlling the second series of switches for ensuring the transfer of the content of register point $M_{k-1}$ to register point $M_k$.

4 Claims, 6 Drawing Figures

ADDRESSING CIRCUIT FOR A MATRIX DISPLAY INCORPORATING SHIFT REGISTERS FORMED FROM STATIC MEMORIES AND ADDRESSING PROCESS USING SUCH A CIRCUIT

The present invention relates to an addressing circuit for a matrix display incorporating shift registers formed from static memories and to an addressing process using such a circuit. It more particularly applies to the addressing of a liquid crystal matrix display used for the display of images and/or alphanumeric characters.

In a matrix display, the addressing of the elementary display points of the rows and columns of said display is effected by means of two shift registers, namely a "row" register and a "column" register, also called a video register.

FIG. 1 diagrammatically shows in simplified form a matrix display equipped with its control circuits.

This display comprises a display screen 1 formed from elementary display points 2 arranged in the form of a matrix of m rows and n columns. These elementary points each have a capacitor, whose dielectric is liquid crystal controlled by a planar transistor.

This display also comprises n analog memories $4_1 \ldots 4_n$, each constituted by a capacitor, which store the sampled video signal 3. The sampling of the video signal in the analog memories is controlled by the "column" shift register having n register points $5_1 \ldots 5_n$, one register point per column. This "column" register is a series writing and parallel reading register.

Addressing of the analog memories $4_1 \ldots 4_n$ is effected by a signal 7 applied to the input of register point $5_1$ of the column shift register. This signal is a "1" signal, which is successively transferred into register points $5_2 \ldots 5_n$ by clock signals 9. The addressed analog memory $4_i$, in which $1 \leq i \leq n$, is that in which the associated register point $5_i$ contains the "1" signal.

In view of the fact that the analog memories $4_1 \ldots 4_n$ are constituted by capacitors of low capacitance, the latter are loaded at each instant to the actual value of video signal 3. In addition, the column register points serve to connect said capacitors to the video signal 3 and to disconnect them at the precise time when the sample is to be taken. Thus, the analog memories $4_1 \ldots 4_n$ are loaded by the final value of the video signal received prior to their disconnection.

Following the storage of the video signal of a complete row j of display points 2 of the display, j being an integer between 1 and m, said video signal can be transferred to the display points 2 of said row by means of the "row" shift register having m register points $6_1 \ldots 6_m$, one register point per row. This row register is also a series writing and parallel reading register. Transfer is ensured by the register point $6_j$ by bringing the transistors associated with each of the display points 2 of row j into the conductive state.

Following the transfer of the video signal to display row j, the analog memories $4_1 \ldots 4_n$ are emptied and then reloaded with the video signal of the following row j+1. During this reloading, the register point $6_{j+1}$ is controlled so as to keep the transistors associated with each of the display points of row j+1 conductive.

The "row" register 6 is controlled in a similar manner to register 5. Register point $6_1$ receives a signal 8 formed by a "1", said "1" signal being transferred by clock signals successively into each register point $6_2 \ldots 6_n$, register point $6_j$, in which $1 \leq j \leq m$, makes conductive the transistors associated with the display points 2 of row j.

FIG. 2 shows in more detailed manner a "column" shift register ($5_1 \ldots 5_n$) according to the prior art. It should be noted that a "row" shift register ($6_j \ldots 6_m$) is virtually identical to the "column" register.

This row register is constituted by register points, each having two dynamic memory points, or one static memory point and one dynamic memory point. In these register points, the information necessary e.g. for addressing column i is stored, in the manner shown in FIG. 2, in a static memory point $S_i$, formed by a bistable (two looped gates). During the transfer of information from the memory point $S_i$ to the memory point $S_{i+1}$, the information contained in the static memory point $S_i$ is temporarily stored in a dynamic memory point $D_i$ mainly constituted by a capacitor. The dynamic memory $D_i$ is indispensable, because it makes it possible to preserve the old information contained in memory point $S_i$, whilst modifying the content thereof.

The displacement of the information from memory point $S_i$ to point $S_{i+1}$ and therefore from one register point to the other is carried out by means of switches $C_1$ and $C_2$, whose closing is respectively controlled by phase-displaced clock pulses $\phi_{11}$ and $\phi_{12}$, produced by a transfer clock 12. Pulses $\phi_{12}$ control the switches $C_2$, enabling the information to be transferred from memory points $S_i$ to memory points $D_i$, whilst pulses $\phi_{11}$ control switches $C_1$ permitting the loading of the first memory point $S_i$ and then the transfer of information from memory points $D_i$ to memory points $S_{i+1}$.

These shift registers are relatively cumbersome and for certain applications, such as e.g. the addressing of a redundant matrix of a display, it is difficult to locate two or more shift register points in the spacing of a control row of the elementary display points, said spacing generally having a width 100 $\mu$m.

The present invention relates to a circuit for addressing a matrix display, incorporating simplified shift registers, as well as to an addressing process using a circuit making it possible to obviate this disadvantage.

More specifically, the present invention relates to an addressing circuit of p rows or p columns of elementary display points of a matrix display having p series writing-parallel reading row or column shift register points, switches interposed between the row or column register points, a first transfer clock supplying clock signals controlling the switches for ensuring the movement of information from one register point to the other, wherein the first clock produces a first clock signal controlling a first series of switches, one switch of said first series being placed in front of one register point $M_{k-1}$, in which k is a number which can assume all the even values between 1 and p, said first clock signal ensuring the loading of a "1" signal into the first register point and the transfer of the content of register point $M_k$ to register point $M_{k+1}$, wherein the first clock produces a second clock signal of the same frequency as the first clock signal and phase-displaced with respect thereto, controlling a second series of switches, one switch of said second series being placed in front of the register point $M_k$, said second clock signal ensuring the transfer of the content of register point $M_{k-1}$ to register point $M_k$ and wherein each register point $M_k$ is formed by a single static memory point.

The addressing circuit according to the invention comprises a row and/or column shift register having twice as many memory points as those of the prior art.

This makes it possible to divide by two the overall dimensions of these registers, as well as the frequency of the first switch control clock. This is more particularly due to the use of a static memory point only.

In the special case of addressing rows of elementary display points of the display, the circuit according to the invention also comprises a third and fourth series of switches used for the transfer of a sampled video signal into the elementary display points of one of the p rows, the switches of the third series being located at the output of register $M_{k-1}$ and the switches of the fourth series being located at the output of the registers $M_k$, as well as a second clock producing a third clock signal controlling the third series of switches and a fourth clock signal of the same frequency as the third clock signal and phase-displaced with respect thereto controlling the fourth series of switches.

The invention also relates to a process for addressing p rows or p columns of elementary display points of a matrix display using the addressing circuit, wherein the following stages are performed:

loading a "1" signal into the first register point with the aid of the first clock signal, the other register points containing a "0" signal;

stepwise transfer of this "1" signal from a register point $M_{k-1}$ to a register point $M_k$ with the aid of the second clock signal, said "1" signal being available at the output of point $M_{k-1}$, then from a register point $M_k$ to a register point $M_{k+1}$ with the aid of the first clock signal, the "1" signal being available at the output of point $M_k$, the register points other than $M_k$ and $M_{k+1}$ containing a "0" signal.

In the special case of addressing two successive rows of display points of a display, the following supplementary stages are advantageously performed:

storing a first video signal in the analog memories having to be transferred to the (k−1)-th row of the display;

transfer of said first video signal from the analog memories to the (k−1)-th row with the aid of a third clock signal controlling a switch of a third series of switches connected to the output of the register point $M_{k-1}$;

storing a second video signal in the analog memories to be transferred to the k-th row of the display; and transfer of said second video signal from the analog memories to the k-th row with the aid of a fourth clock signal of the same frequency as the third clock signal and phase-displaced relative thereto, controlling a switch of the fourth series of switches connected to the output of the register point $M_k$.

The invention is described in greater detail hereinafter relative to non-limitative embodiments and the attached drawings, wherein show:

FIG. 1, already described, shows diagrammatically and in simplified form a matrix display equipped with control circuits according to the prior art.

FIG. 2, already described, shows diagrammatically a prior art row shift register.

The following description relates to a matrix display having n columns and n rows of elementary display points.

Figure 3:
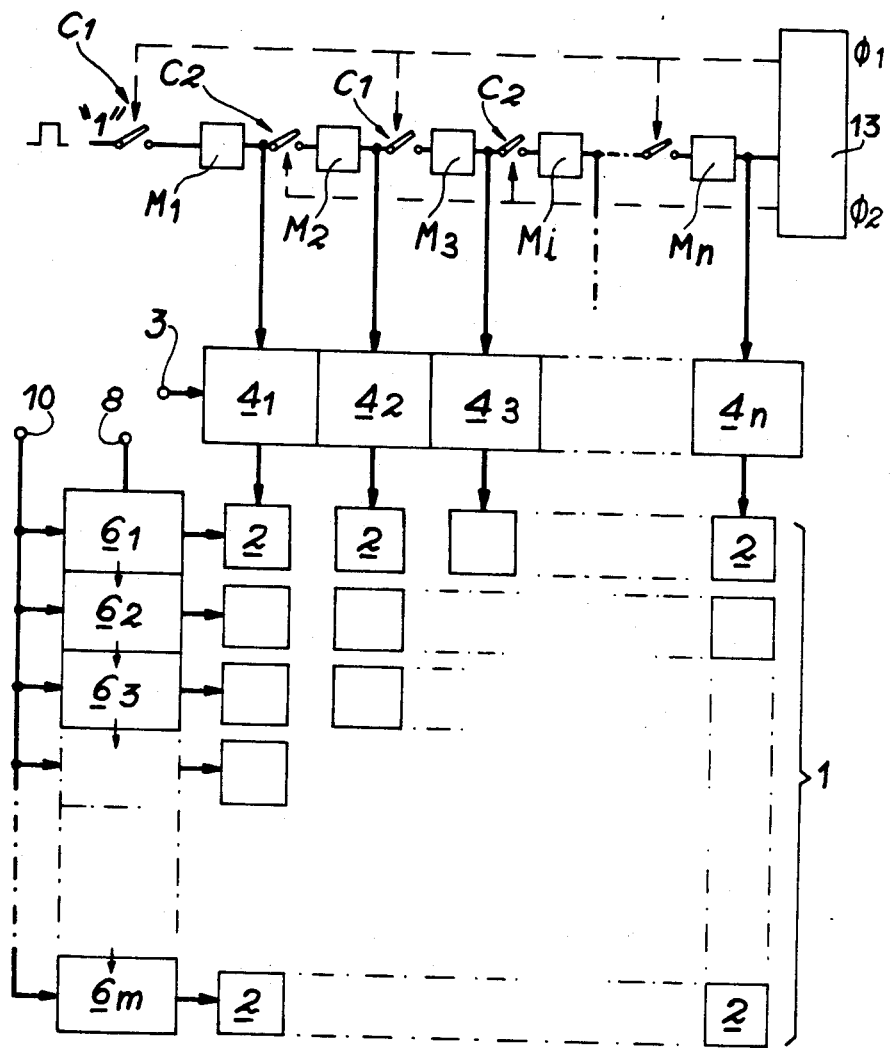
FIG. 3 shows diagrammatically matrix display equipped with a column shift register according to the invention.

FIG. 3 shows a matrix display equipped with a "column" shift register making it possible to address the elementary display points of the display columns.

According to the invention, the column register only has n static memory points $M_1 \ldots M_n$, i.e. one memory point per register point. Each memory point $M_1$, in which i is an integer from 1 to n, is e.g. formed by a single bistable element (two looped gates) constructed on the basis of MOS technology.

Between two consecutive memory points, a switch $C_1$ or $C_2$ is arranged in alternating manner. The control of these switches $C_1$ and $C_2$ is respectively brought about by clock switches $\phi_1$ and $\phi_2$ successively produced by a transfer clock 13.

The clock signal $\phi_1$ simultaneously controls all the switches $C_1$, the latter being used for the pairwise connection and disconnection of the memory points of even subscript ($M_2$, $M_4$, $M_6$) with respect to the memory points of uneven subscript ($M_3$, $M_5$, $M_7$).

In the same way, the clock signal $\phi_2$ simultaneously controls all the switches $C_2$, the latter being used for the pairwise connection and disconnection of the memory points of uneven subscript ($M_1$, $M_3$, $M_5$) with respect to the memory points of even subscript ($M_2$, $M_4$, $M_6$).

Figure 2:
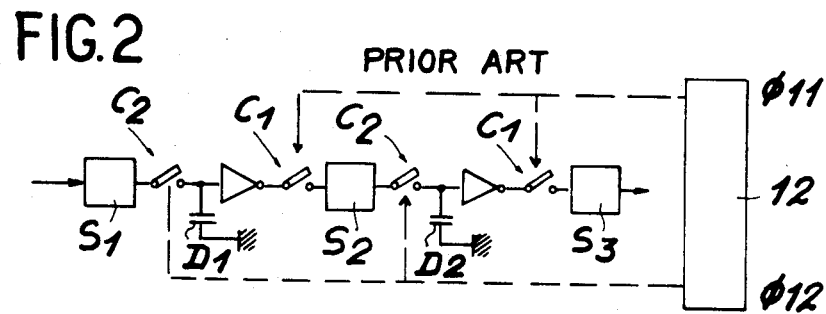

The clock signals $\phi_1$ and $\phi_2$ supplied by the transfer clock 13 have, for a column register of given size, a frequency which is half that of the clock signals $\phi_{11}$ and $\phi_{12}$ supplied by the transfer clock 12 used in a prior art column register, as shown in FIG. 2.

Figure 1:
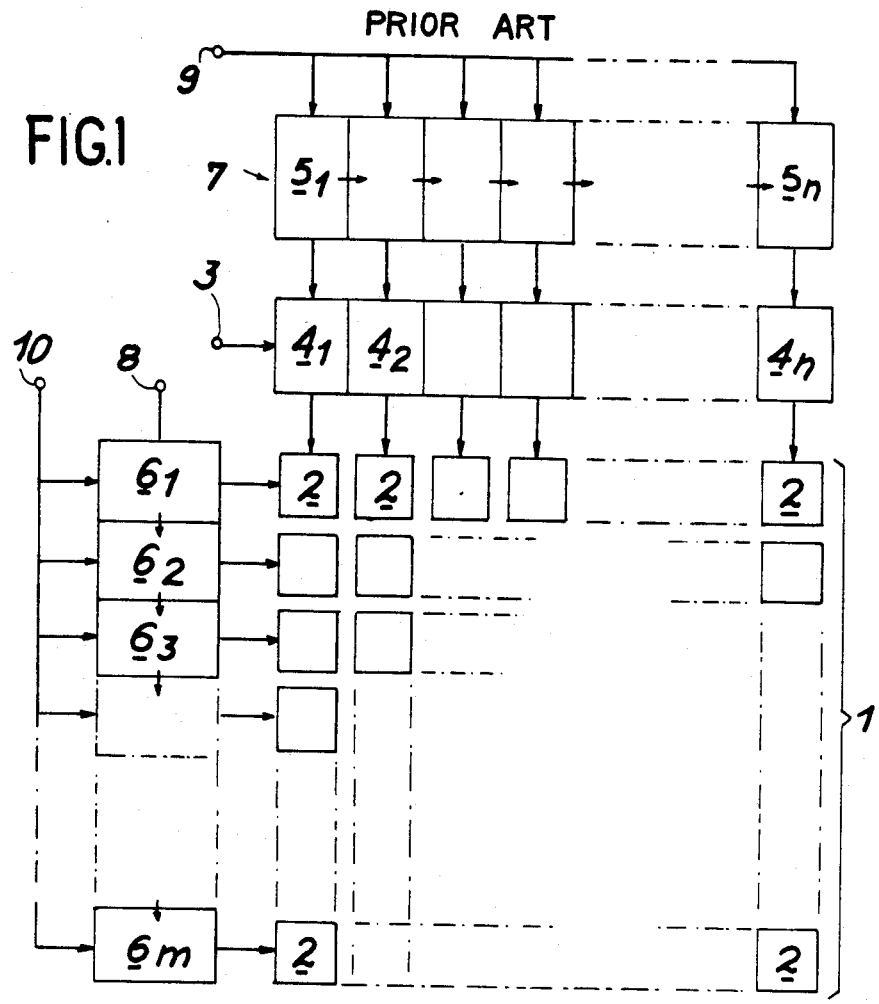
Figure 4:
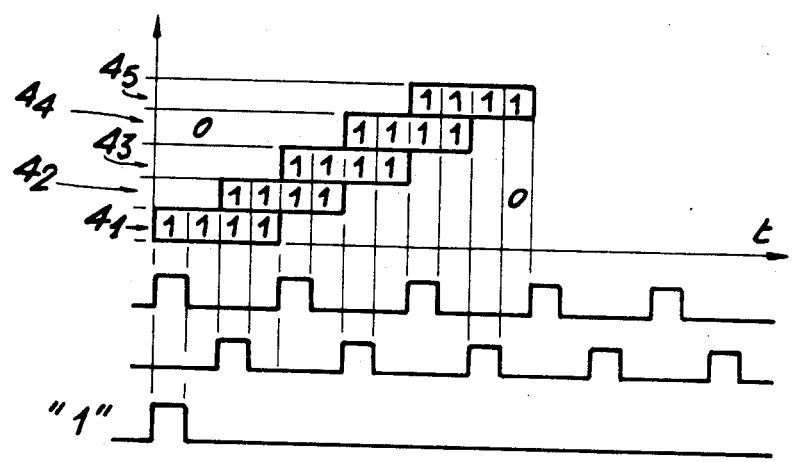
FIG. 4 is a diagram illustrating the states of the column register points during time.

The operation of this column register used for sampling the video signal 3 in the n analog memories $4_1 \ldots 4_n$ (FIG. 1) will be described in greater detail hereinafter relative to FIG. 4, which shows the diagram of the states of the column register point over a period of time. As illustrated in FIG. 4, the clock signals $\phi_1$ and $\phi_2$ are phase-displaced, particularly by $\pi$, and are of the same frequency.

In the initial state, all the memory points $M_i$ are at state 0. The storage of the first addressing information or "1" signal in the memory point $M_1$ to permit the sampling of the video signal 3 in analog memory $4_1$ (FIG. 1) is ensured by the first clock pulse $\phi_1$.

The "1" signal stored in memory point $M_1$ is then transferred to memory point $M_2$ means of the first clock pulse $\phi_2$, whilst being available at the output of the memory point $M_1$ for the sampling of the video signal in analog memory $4_1$. Although signal $\phi_2$ simultaneously controls all the switches $C_2$, only the content of the memory point $M_2$ is modified, the other memory points $M_3$, $M_4$, $M_5$ ... being at state 0. The "1" signal stored in memory point $M_2$ is then transferred to memory point $M_3$ by means of the second clock pulse $\phi_1$, whilst still being available at the output of memory point $M_2$ for sampling the video signal in analog memory $4_2$. During the transfer of the "1" signal from memory point $M_2$ to memory point $M_3$, a "0" signal is introduced into memory point $M_1$. Although signal $\phi_1$ simultaneously controls all the switches $C_1$, only the content of memory point $M_3$ is modified, points $M_4$, $M_5$, $M_6$ ... being at state 0. The movement of the information into the different memory points $M_i$ continues in this way up to the final point (i-n), as does the sampling of the video signal corresponding to a complete row j of display points of the display, j being an integer from 1 to m.

In the column shift register, there are still two "1" (FIG. 4) in the two successive memory points $M_i$ and $M_{i+1}$, except obviously during the loading of memory point $M_1$ and during the sampling of the video signal in memory point $M_n$.

The simultaneous presence of a "1" in the memory points $M_i$ and $M_{i+2}$ is not prejudicial to the sampling of the video signal in the analog memories $M_i$, in view of the fact that these memories are capacitors and are therefore loaded by the final value of video signal 3 received prior to their disconnection. At each clock pulse $\phi_1$ or $\phi_2$ (FIG. 4), an analog memory $4_i$ is disconnected and consequently the corresponding video signal is sampled. In the prior art (FIG. 2), the video signal is only sampled for the clock signals $\phi_{12}$, signal $\phi_{11}$ serving solely for the transfer of the information from one register point to the other. Moreover, the column register according to the invention contains half as many memory elements as compared to the prior art.

Following the storage of the video signal of a complete row j of elementary display points, j ranging from 1 to m, said video signal can be transferred to the display points of said row by means of the "row" shift register according to the invention.

Figure 5:
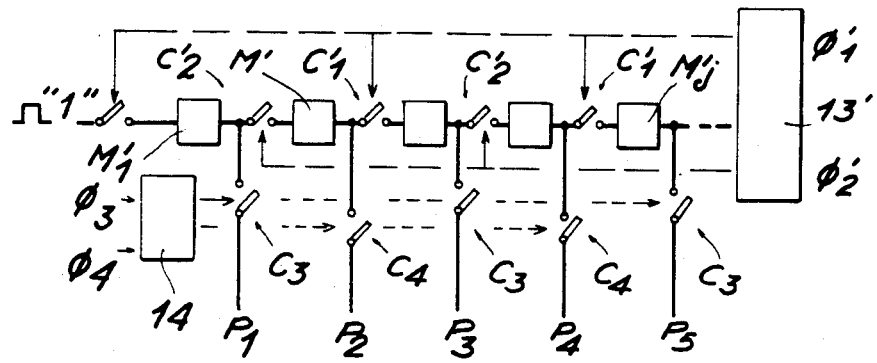
FIGS. 5 shows diagrammatically a row shift register according to the invention.

FIG. 5 shows a "row" shift register according to the invention, which is of the same construction as the "column" register and functions in the same way as the latter. The elements fulfilling the same function carry the same references followed by the apostrophe.

The row register is formed solely by m static memory points $M'_1 \ldots M'_m$, i.e. a single memory point per register point. Each memory point $M'_j$, j ranging from 1 to m, is formed by a bistable element produced according to MOS technology.

Between two consecutive memory points is provided a switch $C'_1$ or $C'_2$ in alternating manner. The simultaneous control of the switches $C'_1$ is ensured by a clock signal $\phi'_1$ and that of the switches $C'_2$ by a clock signal $\phi'_2$.

Figure 6:
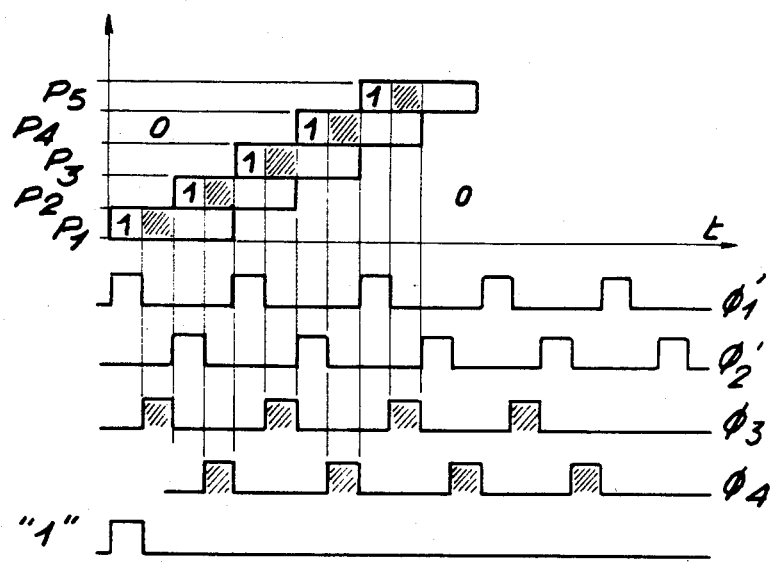
FIG. 6 is a diagram showing the states of the row register points during time.

The signals $\phi'_1$ and $\phi'_2$ successively produced by a transfer clock 13' are phase displaced, e.g. by $\pi$ and are of the same frequency, as shown in FIG. 6.

As for the column register, the first pulse of the signal $\phi'_1$ is used for storing a "1" in the memory point $M'_j$ and the other pulses are used for the transfer of said signal "1" from memory points $M'_2, M'_4, M'_6 \ldots$ to memory points $M'_3, M'_5, M'_7 \ldots$.

In the same way, the clock pulses $\phi'_2$ are used for transferring a "1" signal from the memory points $M'_1, M'_3, M'_5 \ldots$ to the memory points $M'_2, M'_4, M'_6 \ldots$.

As hereinbefore, only the content of one memory point $M'_j$ is modified during the application of the signals $\phi'_1$ or $\phi'_2$.

As for the column shift register, there are still two "1"s, as is shown by FIG. 6, in two successive memory points $M'_j$ and $M'_{j+1}$, the other memory points being at state "0". Unlike in the case of the column register, the presence of these two "1"s, in the row register is prejudicial. Thus, the transfer of the video signal to the display points of the display must only intervene for a single row of display points of the display and not for two of these.

So as to only use a single "1" contained in the row register, at the output of each memory point $M'_j$, and consequently each row register point, is placed in alternating manner a switch $C_3$ or $C_4$. These switches $C_3$ are respectively controlled by the clock signals $\phi_3$ and $\phi_4$ successively produced by a transfer clock 14. The signals $\phi_3$ and $\phi_4$ are relatively phase-displaced and of the same frequency.

Signal $\phi_3$ simultaneously controlling all the switches $C_3$ is used for the transfer of the video signal corresponding to rows 1, 3, 5, 7 of the display points of the display. In the same way, signal $\phi_4$ controlling simultaneously all the switches $C_4$ is used for the transfer of the video signal corresponding to the rows 2, 4, 6 etc of the display points.

To ensure the transfer of the video signal from row j to said row, it is necessary for the different clock pulses to be applied to the different switches $C'_1, C'_2, C_3$ and $C_4$ in the following order: $\phi_1, \phi_3, \phi_2$ and $\phi_4$.

The row shift register according to the invention contains half as many memory elements than that according to the prior art.

What is claimed is:

1. An addressing circuit of p rows or column of elementary display points of a matrix display having p series writing-parallel reading row or column shift register points, switches interposed between the row or column register points, a first transfer clock supplying clock signals controlling the switches for ensuring the movement of information from one register point to the other, characterized in that the first transfer clock produces a first clock signal controlling a first series of switches, one switch of said first series being placed in front of one register point $M_{k-1}$, in which k is a number which can assume all the even values between 1 and p, said first clock signal ensuring the loading of a "1" signal into the first register point ($M_1, M'_1$) and the transfer of the content of register point $M_k$ to register point $M_{k+1}$, in that the first transfer clock produces a second clock signal of the same frequency as the first clock signal and phase-displaced with respect thereto, controlling a second series of switches, one switch of said second series being placed in front of the register point $M_k$, said second clock signal ensuring the transfer of the content of register point $M_{k-1}$ to register point $M_k$ and in that each register point $M_k$ is formed by a single static memory point ($M_i, N'_j$).

2. The addressing circuit according to claim 1, of the p rows of elementary display points of the display, characterized in that said addressing circuit further comprises third and fourth series of switches used for the transfer of a sampled video signal into the elementary display points of one of the p rows, the switches of the third series being located at the output of the registers $M_{k-1}$ and the switches of the fourth series being located at the output of the registers $M_k$, and in that said addressing circuit comprises a second transfer clock producing a third clock signal controlling the third series of switches and a fourth clock signal of the same frequency as the third clock signal and phase-displaced with respect thereto controlling the fourth series of switches.

3. A process for addressing p rows or p columns of elementary display points of a matrix display using the addressing circuit according to claim 1, characterized in that the following stages are performed:
  loading a "1" signal into the first register point ($M_1, M'_1$) with the aid of the first clock signal, the other register point containing a "0" signal;
  stepwise transfer of this "1" signal from a register point $M_{k-1}$ to a register point $M_k$ with the aid of the second clock signal, said signal "1" being available at the output of point $M_{k-1}$, then from a register point $M_k$ to a register point $M_{k+1}$ with the aid of the first clock signal, the "1" signal being available at the output of point $M_k$, the register points other than $M_k$ and $M_{k+1}$ containing a "0" signal.

4. The process according to claim 3 for addressing two successive rows of elementary display points of the display, characterized in that the following steps are performed:

storing a first video signal in the analog memories having to be transferred to the (k−1)-th row of the display;

transfer of said first video signal from the analog memories to the (k−1)-th row with the aid of a third clock signal controlling a switch of a third series of switches connected to the output of the register point $M_{k-1}$;

storing a second video signal in the analog memories to be transferred to the k-th row of the display; and transfer of said second video signal from the analog memories to the k-th row with the aid of a fourth clock signal of the same frequency as the third clock signal and phase-displaced relative thereto, controlling a switch of the fourth series of switches connected to the output of the register point $M_k$.

* * * * *